United States Patent [19]

Mizuno

[11] Patent Number: 5,726,562
[45] Date of Patent: Mar. 10, 1998

[54] SEMICONDUCTOR DEVICE AND POWER SUPPLY CONTROLLER FOR SAME

[75] Inventor: Masayuki Mizuno, Tokyo, Japan

[73] Assignee: NEC Corporation, Tokyo, Japan

[21] Appl. No.: 711,110

[22] Filed: Sep. 9, 1996

[30] Foreign Application Priority Data

Sep. 7, 1995 [JP] Japan ................................. 7-255546

[51] Int. Cl.$^6$ ................................................. G05F 3/04
[52] U.S. Cl. ...................... 323/312; 327/537; 365/156
[58] Field of Search ............................. 323/312, 349, 323/352; 363/62, 100, 140; 327/537; 365/156, 226, 227, 229

[56] References Cited

U.S. PATENT DOCUMENTS

| | | | |
|---|---|---|---|
| 5,046,052 | 9/1991 | Miyaji et al. | 365/226 |
| 5,357,416 | 10/1994 | Kitano et al. | 323/313 |
| 5,523,966 | 6/1996 | Idei et al. | 365/156 |
| 5,565,811 | 10/1996 | Park et al. | 327/546 |
| 5,592,423 | 1/1997 | Tokami | 365/226 |
| 5,600,588 | 2/1997 | Kawashima | 365/156 |

OTHER PUBLICATIONS

"Static–Noise Margin Analysis of MOS SRAM Cells" Evert Seevinck et al., IEEE Journal of Solid–State Circuits, vol. SC–22, No. 5, Oct. 1987.

*Primary Examiner*—Stuart N. Hecker
*Attorney, Agent, or Firm*—Sughrue, Mion, Zinn, Macpeak & Seas, PLLC

[57] ABSTRACT

A semiconductor device includes a first power supply line of a high potential, a second power supply line of a low potential, a third power supply line which is alternatively set to a potential equal to that of the first power supply line or to a potential lower than that of the first power supply line by some degree, and a fourth power supply line which is alternatively set to a potential equal to that of the second power supply line or to a potential higher than that of the second power supply line by some degree. A substrate bias terminal of each of pMOS transistors included in a static memory cell is connected to the first power supply line, and a source of each pMOS transistor is connected to the third power supply line. A substrate bias terminal of each of nMOS transistors included in a static memory cell is connected to the second power supply line, and a source of each pMOS transistor is connected to the fourth power supply line. In an operating condition, the third and fourth power supply lines are brought to the same potential as that of the first and second power supply lines, respectively. In a standby condition, the third and fourth power supply lines are brought to a potential lower and higher than that of the first and second power supply lines, respectively.

9 Claims, 4 Drawing Sheets

SEMICONDUCTOR DEVICE AND POWER SUPPLY CONTROLLER FOR SAME

BACKGROUND OF THE INVENTION

1. Field of the Invention

The present invention relates to a semiconductor device such as a MOS semiconductor memory, using MOS transistors, and a control circuit for controlling a power supplying for driving the semiconductor device.

2. Description of Related Art

Referring to FIG. 1, there is shown a circuit diagram of a static memory cell, which is one example of the conventional semiconductor memory.

The shown static memory cell includes a pair of pMOS transistors P21 and P22 having a source common-connected to a first power supply line 101, and a pair of nMOS transistors N21 and N22 having a source common-connected to a second power supply line 102 and a drain and a gate connected to a drain and a gate of the pMOS transistors P21 and P22, respectively, the gate of each of the nMOS transistors N21 and N22 being cross-connected to the drain of the other nMOS transistor. In addition, the gate of the nMOS transistor N21 is connected through a selection nMOS transistor N23 to a first bit line B1, and the gate of the nMOS transistor N22 is connected through a selection nMOS transistor N24 to a second bit line B2 complementary to the first bit line B1. A gate of each of the nMOS transistors N23 and N24 is connected to a word line W.

In the above mentioned semiconductor memory, by applying a predetermined voltage to the word line W, it becomes possible to execute a data writing/reading to the memory cell composed of the MOS transistors N21, N22, P21 and N22 through the bit lines B1 and B2.

Since the construction and the operation of the above mentioned semiconductor memory are well known to persons skilled in the art, further explanation thereof will be omitted.

A reading speed of the above mentioned conventional semiconductor memory is determined by how fast the amplitude of the bit lines B1 and B2 become large when the word line W is activated. The larger an on-current of each of the MOS transistors P21 and N22 and N21 to N24 is, the higher the reading speed becomes. Accordingly, the reading speed becomes high by lowering a threshold voltage of each MOS transistor. However, if the threshold voltage of each MOS transistor is lowered, a "steady-state" current flowing between the first power supply line 101 and the second power supply line 102 becomes as large as it cannot be ignored. In other words, a consumed electric power of the semiconductor memory increases.

For example, consider that the semiconductor memory shown in FIG. 1 is used as a cache memory incorporated in a microprocessor. In ordinary cases, the threshold of transistors, which constitute the microprocessor, is fixedly determined to have only one value for all nMOS transistors and only one value for all pMOS transistors. Therefore, if the whole of the microprocessor is constituted of only transistors having a low threshold in order to elevate an operation speed of the microprocessor, the above mentioned "steady-state" current in the cache memory becomes large, and the consumed electric power of the overall microprocessor increases.

Therefore, it becomes necessary to constitute the microprocessor of nMOS transistors having a low threshold and pMOS transistors having a low threshold and nMOS transistors having a high threshold and pMOS transistors having a high threshold in such a manner that the cache memory is constituted of the transistors having the high threshold. However, this approach requires to manufacture two kinds having different thresholds in the same channel type transistors, with the result that the number of steps for manufacturing the semiconductor device increases, and correspondingly, the manufacturing cost increases.

SUMMARY OF THE INVENTION

Accordingly, it is an object of the present invention to provide a semiconductor device which has overcome the above mentioned defect of the conventional one.

Another object of the present invention is to provide a semiconductor device having an increased operation speed and a reduced consumed electric power, and a control circuit therefor.

The above and other objects of the present invention are achieved in accordance with the present invention by a semiconductor device including a circuit composed of MOS transistors having a threshold voltage set to a low value, a source electrode of the MOS transistors being a power supply line which is made alternatively equal to a substrate bias potential of the MOS transistors in an operating condition of the semiconductor device or to a potential higher than the substrate bias potential in an absolute potential in a standby condition of the semiconductor device.

For example, the semiconductor device includes a first power supply line of a high potential, a second power supply line of a low potential, a third power supply line which is alternatively set to a potential equal to that of the first power supply line or to a potential lower than that of the first power supply line, and a fourth power supply line which is alternatively set to a potential equal to that of the second power supply line or to a potential higher than that of the second power supply line. In the case that the semiconductor device is a CMOS static memory, a substrate bias terminal of each of pMOS transistors is connected to the first power supply line, and a source of, each pMOS transistor is connected to the third power supply line. A substrate bias terminal of each of nMOS transistors is connected to the second power supply line, and a source of each nMOS transistor is connected to the fourth power supply line. In the operating condition, the third and fourth power supply lines are brought to the same potential as that of the first and second power supply lines, respectively. In the standby condition, the third and fourth power supply lines are brought to the above mentioned lower potential and the above mentioned higher potential, respectively.

According to another aspect of the present invention, there is provided a control circuit including a first power supply line supplied with a high potential, a second power supply line supplied with a low potential, a third power supply line connected through a first potential difference generating circuit to the first power supply line so that a potential lower than the high potential by a potential difference created by the first potential difference generating circuit is supplied to the third power supply fine, a fourth power supply line connected through a second potential difference generating circuit to the second power supply line so that a potential higher than the low potential by a potential difference created by the second potential difference generating circuit is supplied to the fourth power supply line, a first switch means connected between the first and third power supply lines, for short-circuiting between the first and third power supply lines when the first switch means is closed, a second switch means connected between the second and fourth power supply lines, for short-circuiting between the second and fourth power supply fines when the second switch means is closed, and a control line connected to a control input of the first and second switch means means to simultaneously on-off control the first and second switch means means.

In a preferred embodiment, the control circuit further includes a first series circuit composed of a third switch means and a first capacitor and connected between the third and fourth power supply lines, and a second series circuit composed of a fourth switch means and a second capacitor and connected between the third and fourth power supply lines. The third switch means is interlocked with the first switch means so that the first and third switch means always take the same on-off condition, and the fourth switch means is interlocked with the second switch means so that the second and fourth switch means always take the same on-off condition.

The above and other objects, features and advantages of the present invention will be apparent from the following description of preferred embodiments of the invention with reference to the accompanying drawings.

DESCRIPTION OF THE PREFERRED EMBODIMENTS

Figure 1:
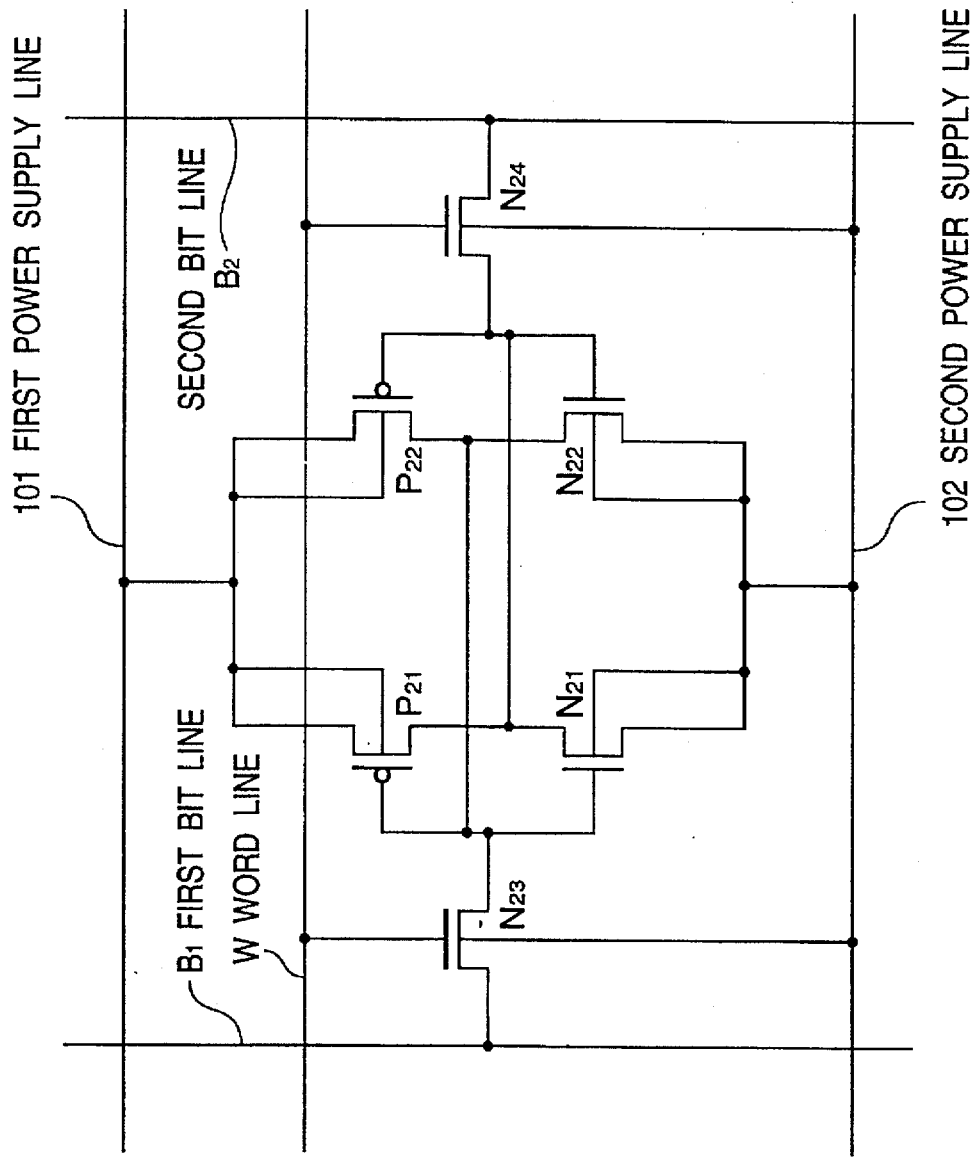
FIG. 1 is a circuit diagram of a conventional static memory cell.
Figure 2:
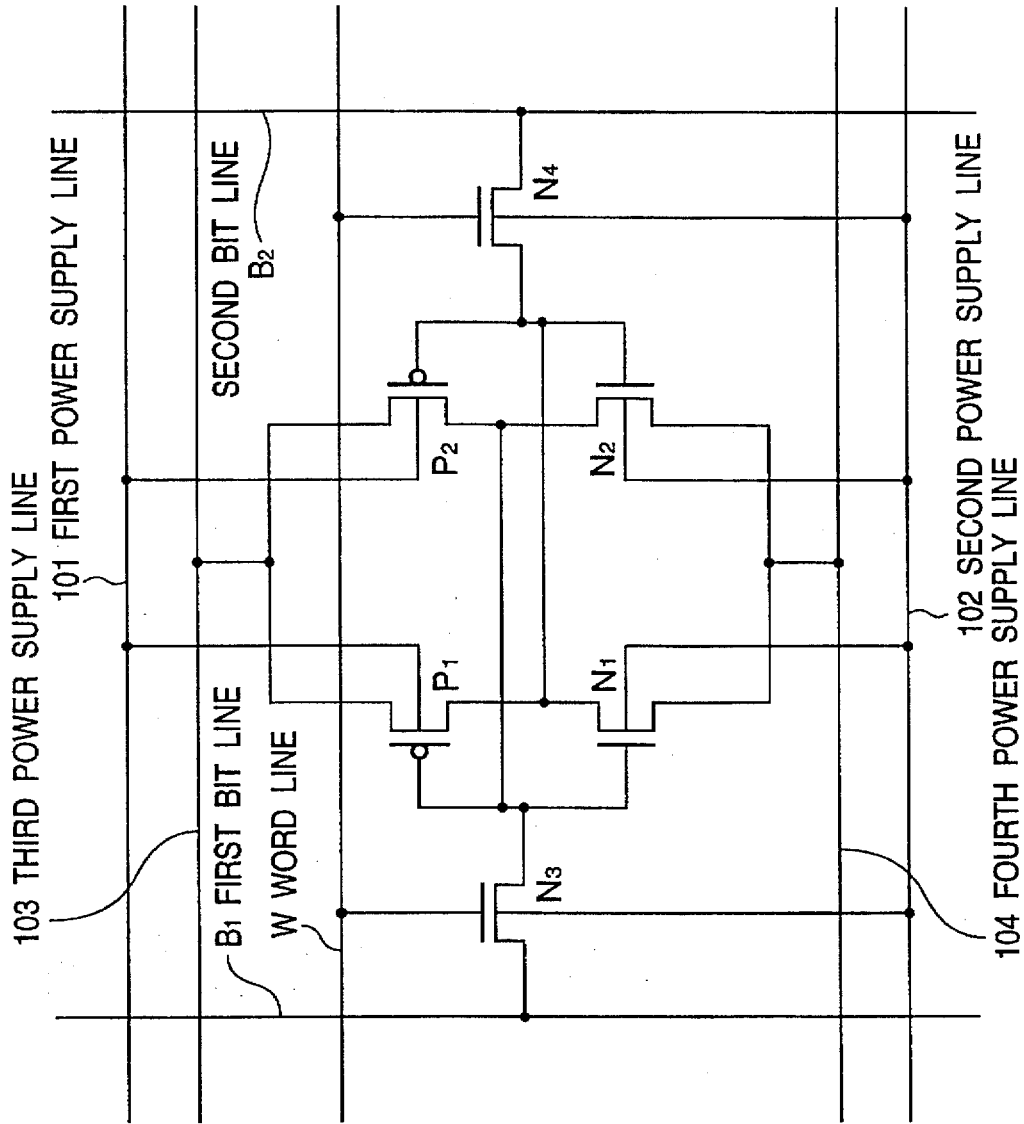
FIG. 2 is a circuit diagram of a first embodiment of the semiconductor memory cell in accordance with the present invention.

Referring to FIG. 2, there is shown a circuit diagram of a first embodiment of a semiconductor memory cell in accordance with the present invention.

The shown circuit diagram illustrates an embodiment in which the present invention is applied to a six-element type static memory cell. The shown memory cell includes a pair of nMOS transistors N1 and N2 cross-connected to each other and a pair of pMOS transistors P1 and P2 connected in series with the nMOS transistors N1 and N2, respectively, between a first power supply line 101 of a high potential and a second power supply line 102 of a low potential. Namely, a first CMOS inverter is constituted of the nMOS transistor N1 and the pMOS transistor P1, and a second CMOS inverter is constituted of the nMOS transistor N2 and the pMOS transistor P2. These two inverters are connected to each other in a back-to-back fashion so that an output of each inverter is connected to an input of the other inverter.

Furthermore, the gate of the nMOS transistor N1 is connected through a selection transistor N3 to a first bit line B 1, and the gate of the nMOS transistor N2 is connected through a selection transistor N4 to a second bit line B2. A gate of each of the nMOS transistors N3 and N4 is connected to a word line W.

Furthermore, the shown embodiment includes a third power supply line 103 of a potential lower than that of the first power supply line 101 by some degree, and a fourth power supply line 104 of a potential higher than that of the second power supply line 102. A source of each of the nMOS transistors N1 and N2 is connected to the fourth power supply line 104, and a substrate bias terminal (namely, back gate) of each of the nMOS transistors N1 and N2 is connected to the second power supply line 102. In addition, a source of each of the pMOS transistors P1 and P2 is connected to the third power supply line 103, and a substrate bias terminal (namely, back gate) of each of the pMOS transistors P1 and P2 is connected to the first power supply line 101. Thus, in each of the nMOS transistor N1 and N2, a substrate potential is lower than a source potential, and in each of the pMOS transistor P1 and P2, a substrate potential is higher than a source potential.

More specifically, the first pMOS transistor P1 has the substrate bias terminal connected to the first power supply line 101, the source connected to the third power supply line 103, the drain connected to the drain of the first nMOS transistor N1, and the gate connected to the gate of the first nMOS transistor N1. The second pMOS transistor P2 has the substrate bias terminal connected to the first power supply line 101, the source connected to the third power supply line 103, the drain connected to the drain of the second nMOS transistor N2, and the gate connected to the gate of the second nMOS transistor N2.

Furthermore, the first nMOS transistor N1 has the substrate bias terminal connected to the second power supply line 102, the source connected to the fourth power supply line 104, and the drain connected to the drain of the first pMOS transistor P1 and the drain of the third nMOS transistor N3. The second nMOS transistor N2 has the substrate bias terminal connected to the second power supply line 102, the source connected to the fourth power supply line 104, and the drain connected to the drain of the second pMOS transistor P2 and the drain of the fourth nMOS transistor N4. The third nMOS transistor N3 has the substrate bias terminal connected to the second power supply line 102, the source connected to the first bit line B1, and the gate connected to the word line W. The fourth nMOS transistor N4 has the substrate bias terminal connected to the second power supply line 102, the source connected to the second bit line B2, and the gate connected to the word line W.

Thus, in the shown embodiment, each of the MOS transistors P1, P2 and N1 to N4 is such that the substrate bias terminal is separated from the source electrode, and the substrate bias terminal and the source electrode are connected to different power supply lines, respectively. With this arrangement, it is possible to make the source potential equal to the substrate bias potential in an operating condition of the semiconductor memory, but to make the source potential of the nMOS transistors higher than the substrate bias potential and the source potential of the pMOS transistors lower than the substrate bias potential, respectively, in a standby condition of the semiconductor memory.

In the standby condition of the semiconductor memory, if the potential of the third power supply line 103 is made lower than the potential of the first power supply line 101 and the potential of the fourth power supply line 104 is made higher than the potential of the second power supply line 102 so that the substrate bias potential of the nMOS transistors is made higher than the source potential and the substrate bias potential of the pMOS transistors is made lower than the source potential, the threshold voltage of each MOS transistor become high, with the result that, a "steady-state" current in each transistor in the standby condition becomes extinct, and therefore, the consumed electric power can be remarkably reduced.

On the other hand, in the operating condition of the semiconductor memory, if the potential of the third and fourth power supply lines 103 and 104 are made equal to the potential of the first and third power supply lines 101 and 102, so that the substrate bias potential of each MOS transistor is made equal to the source potential, the threshold voltage of each MOS transistor become as low as an initially set value, with the result that, an operation speed of each transistor is elevated, and therefore, the semiconductor memory can operate with a high speed.

Figure 3:
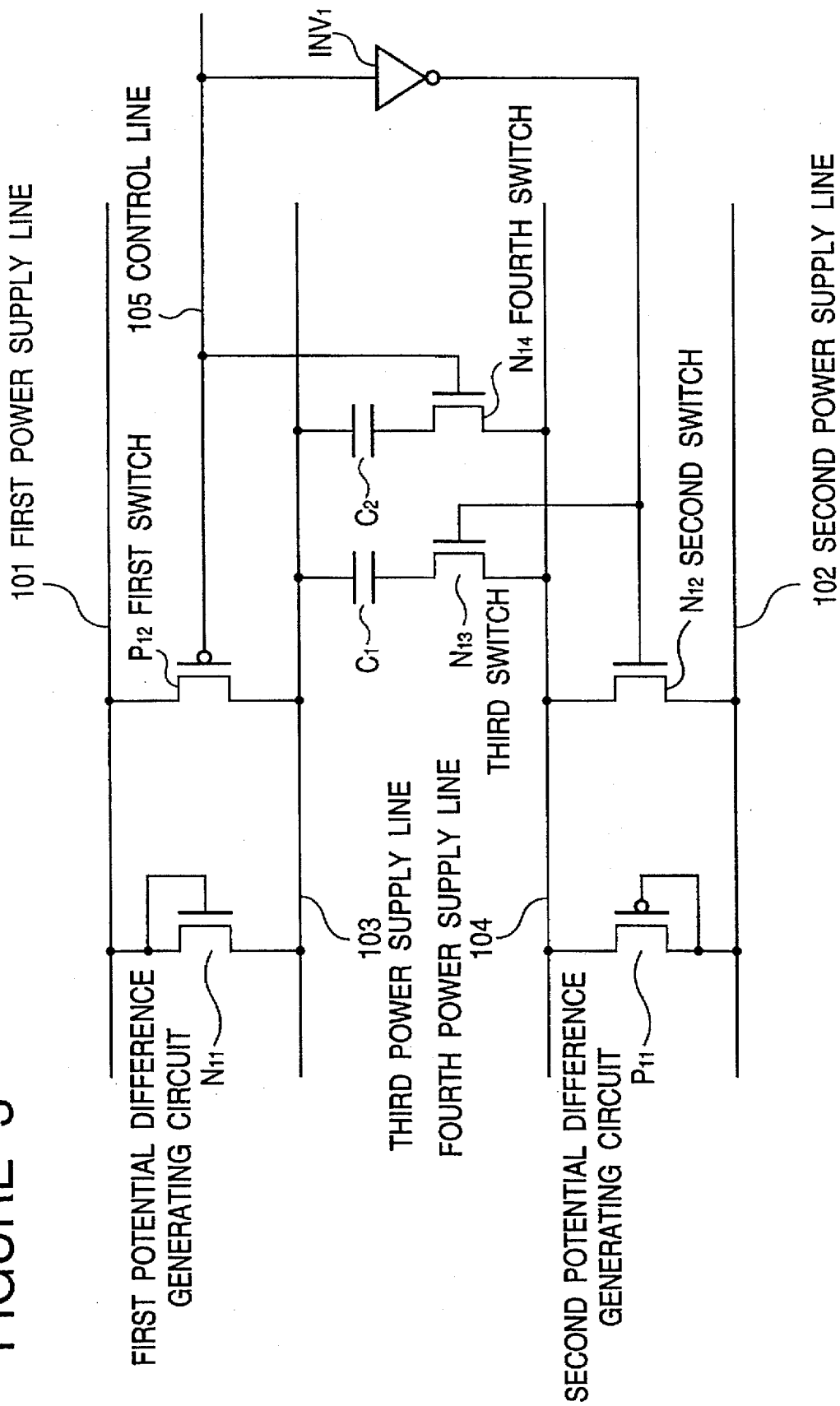
FIG. 3 is a circuit diagram of an embodiment of a control circuit in accordance with the present invention for driving and controlling the semiconductor memory cell in accordance with the present invention.

Referring to FIG. 3, there is shown a circuit diagram of an embodiment of a control circuit in accordance with the present invention for supplying necessary voltages to the first to fourth power supply lines 101 to 104 in the semiconductor memory shown in FIG. 2.

The shown control circuit has the first power supply line 101 and the second power supply line 102 which are supplied with predetermined voltages from an external power supply (not shown), respectively. Between the first power supply line 101 and the third power supply line 103, there is connected a first potential difference generating circuit composed of an nMOS transistor N11 connected in the form of a diode for supplying the third power supply line 103 with a potential which is lower than that of the first power supply line 101 by a gate-source voltage of the nMOS transistor N11. Between the second power supply line 102 and the fourth power supply line 104, there is connected a second potential difference generating circuit composed of a pMOS transistor P11 connected in the form of a diode for supplying the fourth power supply line 104 with a potential which is higher than that of the second power supply line 102 by a gate-source voltage of the pMOS transistor P11.

Furthermore, between the first power supply line 101 and the third power supply line 103, there is connected a first switch constituted of a pMOS transistor P12, which has a gate connected to a control line 105. Similarly, between the second power supply line 102 and the fourth power supply line 104, there is connected a second switch constituted of an nMOS transistor N12, which has a gate connected to an output of an inverter INV1 having an input connected to the control line 105.

In addition, between the third power supply line 103 and the fourth power supply line 4, there are connected a series-connected circuit of a first capacitor C1 and an nMOS transistor N13, which constitutes a third switch and which has a gate connected to the output of the inverter INV1, and another series-connected circuit of a second capacitor C2 and an nMOS transistor N14, which constitutes a fourth switch and which has a gate connected to the control line 105.

In the control circuit as mentioned above, when the control line 105 is at a low level, the first switch P12, the second switch N12 and the third switch N13 are closed, and the fourth switch N14 is opened. Therefore, the potential of the third power supply line 103 is made equal to that of the first power supply line 101, and the potential of the fourth power supply line 104 is made equal to that of the second power supply line 102. In a steady state, an electric charge corresponding to a potential difference between the first power supply line 101 and the second power supply line 102 is retained or preserved in the first capacitor C1.

On the other hand, when the control line 105 is at a high level, the first switch P12, the second switch N12 and the third switch N13 are opened, and the fourth switch N14 is closed. Therefore, the potential of the third power supply line 103 is made lower than that of the first power supply line 101, by action of the first potential difference generating circuit N11, and the potential of the fourth power supply line 104 is made higher than that of the second power supply line 102, by action of the second potential difference generating circuit P11. In a steady state, an electric charge corresponding to a potential difference between the above mentioned potential lower than that of the first power supply line 101 and the above mentioned potential higher than that of the second power supply line 102 is retained or preserved in the second capacitor C2.

As seen from the above, depending upon whether the control line 105 is at the low level or at the high level, the potential of each of the third power supply line 103 and the fourth power supply line 104 is different. However, since the first capacitor C1 retains the potential difference between the third power supply line 103 and the fourth power supply line 104 when the control line 105 is at the low level and since the second capacitor C2 retains the potential difference between the third power supply line 103 and the fourth power supply line 104 when the control line 105 is at the high level, the potential transiting time of each of the third power supply line 103 and the fourth power supply line 104 when the control line 105 changes from the high level to the low level and vice versa, can be shortened by the potential difference retained in each of the capacitors.

Namely, when the control line 105 changes from the high level to the low level and vice versa, an initial value of a potential difference given between the third power supply line 103 and the fourth power supply line 104 by the electric charge preserved in the first capacitor C1 or the second capacitor C2 connected between the third power supply line 103 and the fourth power supply line 104, is equal to the potential difference between the third power supply line 103 and the fourth power supply line 104 when the potential of each of the third power supply line 103 and the fourth power supply line 104 becomes a steady state. Therefore, the potential of each of the third power supply line 103 and the fourth power supply line 104 is quickly brought into the steady state.

If the control circuit shown in FIG. 3 is combined with the semiconductor memory of the first embodiment shown in FIG. 2, in response to the low level (operating condition) and the high level (standby condition) of the control line 105, in the operation condition of the semiconductor memory, the source potential of the MOS transistors included in the semiconductor memory can be made equal to the substrate bias potential thereof, and in the standby condition of the semiconductor memory, the source potential of each nMOS transistor can be made higher than the substrate bias potential thereof and the source potential of each pMOS transistor can be made lower than the substrate bias potential thereof.

As mentioned above, when the source potential of each nMOS transistor can be made higher than the substrate bias potential thereof, the threshold voltage of the nMOS transistor becomes high, and when the source potential of each pMOS transistor can be made lower than the substrate bias potential thereof, the threshold voltage of the pMOS transistor becomes high. Thus, in the operating condition, the threshold of the MOS transistors are low, and therefore, the semiconductor memory can operate with a high speed, and on the other hand, in the standby condition, the threshold of the MOS transistors become high, and therefore, the "steady-state current becomes extinct, with the result that the consumed electric power can be reduced.

Figure 4:
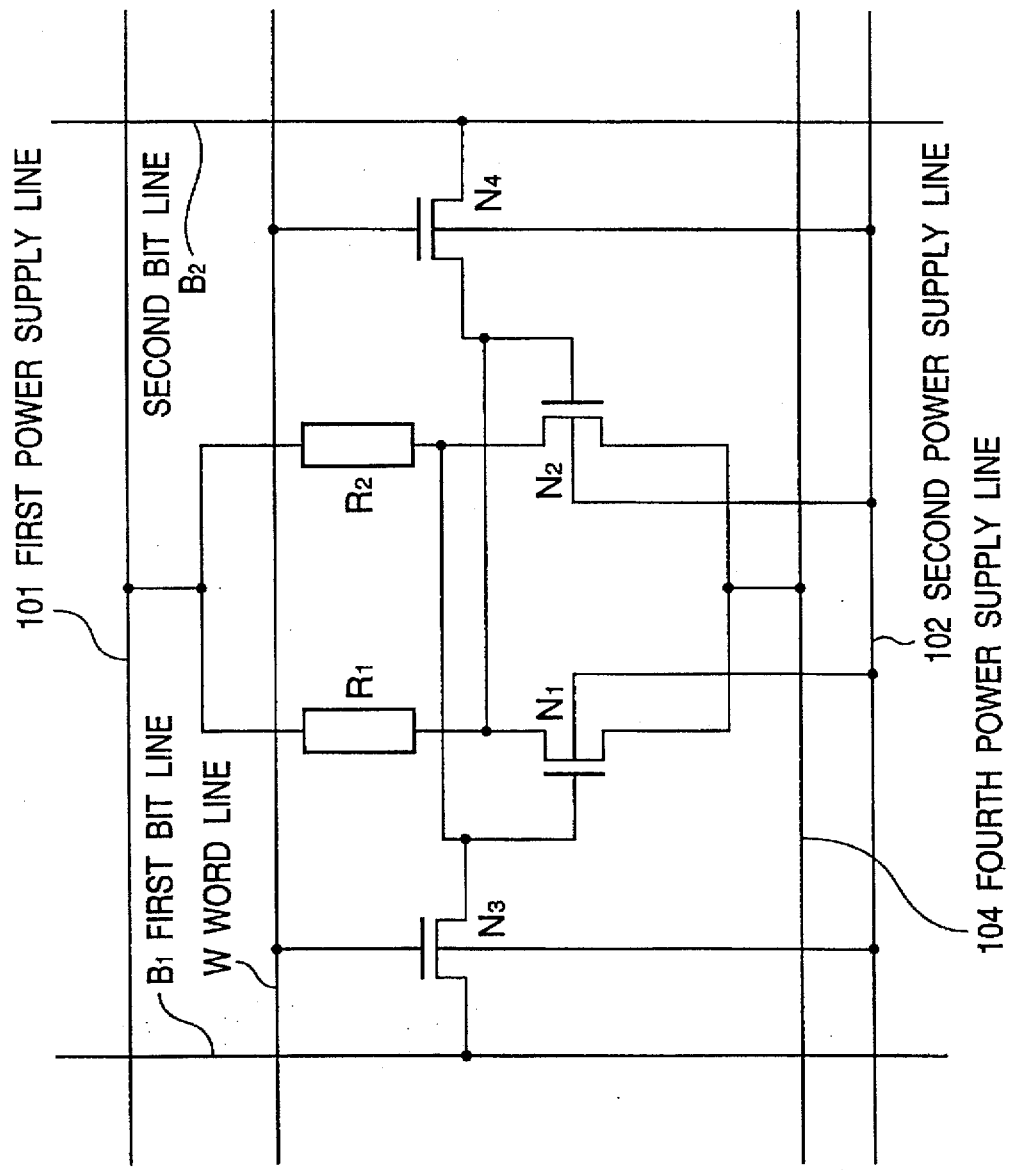
FIG. 4 is a circuit diagram .of a second embodiment of the semiconductor memory cell in accordance with the present invention.

Referring to FIG. 4, there is shown a circuit diagram of a second embodiment of the semiconductor memory cell in accordance with the present invention. In FIG. 4, elements similar to those shown in FIG. 2 are given the same Reference Numerals and Signs, and explanation thereof will be omitted.

As seen from comparison between FIGS. 2 and 4, the second embodiment is characterized in that the pMOS transistors P1 and P2 of the first embodiment is replaced with resistors R1 and R2, respectively. Since the pMOS transistors P1 and P2 of the first embodiment operate as a load for the nMOS transistors N1 and N2, respectively, although the pMOS transistors P1 and P2 are replaced with the resistors R1 and R2, respectively, the same function can be obtained. Therefore, further explanation thereof will be omitted.

Thus, even in this second embodiment, each of the MOS transistors N1 to N4 is such that the substrate bias terminal is separated from the source, and the substrate bias terminal and the source are connected to different power supply lines, respectively. Therefore, in the operating condition of the semiconductor memory, by making the source potential equal to the substrate potential, it is possible to lower the threshold so that the high operation speed can be obtained. In the standby condition of the semiconductor memory, by making the source potential of the nMOS transistors higher than the substrate potential thereof, it is possible to elevate the threshold so that the "steady-state" current can be extinguished and therefore the consumed electric power can be reduced.

Incidentally, the control circuit in accordance with the present invention can be applied to not only the semiconductor device in accordance with the present invention, but also a semiconductor device constituted of MOS transistors having a substrate bias terminal and a source electrode which can be connected to independent power supply lines, respectively. In this case, in an operation condition, the semiconductor device can operate with a high speed by lowering the threshold of the MOS transistors, and in a standby condition, the "steady-state" current can be extinguished by elevating the threshold, so that the consumed electric power can be reduced.

As seen from the above, the semiconductor device in accordance with the present invention is characterized in that the substrate bias terminal of the MOS transistor is separated from the source electrode, and the substrate bias terminal and the source electrode are connected to different power supply lines, respectively. Therefore, in the operating condition of the semiconductor memory, by making the source potential and the substrate bias potential of the MOS transistor equal to each other, it is possible to lower the threshold so that the high operation speed can be obtained. In the standby condition of the semiconductor memory, by making the source potential of the MOS transistor higher than the substrate potential thereof in an nMOS transistor (and lower than the substrate potential thereof in a pMOS transistor), it is possible to elevate the threshold so that the "steady-state" current can be extinguished and therefore the consumed electric power can be reduced.

Furthermore, the control circuit in accordance with the present invention is characterized in that a potential difference generating circuit and a switch are connected between the first and third power supply lines and between the second and fourth power supply lines, and are alternatively activated to make the potential of the third and fourth power supply lines equal to that of the first and second power supply lines, or to make the potential of the third and fourth power supply lines smaller than that of the first and second power supply lines, in an absolute value considering an intermediate or center potential between the first and second power supply lines as a zero potential. The control circuit in accordance with the present invention can realize the high speed operation and the reduction of the consumed electric power in the above mentioned semiconductor device in accordance with the present invention. Furthermore, by inserting the series circuit of the capacitor and the switch between the third and fourth power supply lines, it is possible to quickly change the source potential of the MOS transistors. Therefore, the semiconductor device can be quickly switched from the operation condition to the standby condition and vice versa.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device comprising:
   a circuit composed of MOS transistors having a threshold voltage set to a low value, a source electrode of said MOS transistors being a power supply line which is made alternatively equal to a substrate bias potential of said MOS transistors in an operating condition of the semiconductor device or to a potential higher than said substrate bias potential in an absolute potential in a standby condition of the semiconductor device;
   a first power supply line of a high potential;
   a second power supply line of a low potential;
   a third power supply line which is alternatively set to a potential equal to that of said first power supply line or to a potential lower than that of said first power supply line by some degree, and
   a fourth power supply line which is alternatively set to a potential equal to that of said second power supply line or to a potential higher than that of said second power supply line by some degree;
   wherein said circuit is a memory cell circuit which includes:
   a first inverter having a first pMOS transistor and a first nMOS transistor connected in series,
   a second inverter having a second pMOS transistor and a second nMOS transistor connected in series, said first inverter and said second inverter being connected in such a back-to-back manner that an output of each inverter is connected to an input of the other inverter,
   a third nMOS transistor connected between a first bit and the input of said first inverter and having a gate connected to a word line, and
   a fourth nMOS transistor connected between a second bit and the input of said second inverter and having a gate connected to said word line;
   a substrate bias terminal of each of said first and second pMOS transistors being connected to said first power supply line, a source of each of said first and second pMOS transistors being connected to said third power supply line, a substrate bias terminal of each of said first to fourth nMOS transistors being connected to said second power supply line, a source of each of said first and second nMOS transistors being connected to said fourth power supply line; the semiconductor device further comprising a control circuit including:

said first power supply line supplied with a high potential, said second power supply line supplied with a low potential, said third power supply line connected through a first potential difference generating circuit to said first power supply line so that a potential lower than said high potential by a potential difference created by said first potential difference generating circuit is supplied to said third power supply line, said fourth power supply line connected through a second potential difference generating circuit to said second power supply line so that a potential higher than said low potential by a potential difference created by said second potential difference generating circuit is supplied to said fourth power supply line, a first switch means connected between said first and third power supply lines for short-circuiting between said first and third power supply lines when said first switch means is closed, a second switch means connected between said second and fourth power supply lines for short-circuiting between said second and fourth power supply lines when said second switch means is closed, and a control line connected to a control input of said first and second switch means to simultaneously on-off control said first and second switch means.

2. A semiconductor device claimed in claim 1 wherein said control circuit further includes a first series circuit composed of a third switch means and a first capacitor and connected between said third and fourth power supply lines, and a second series circuit composed of a fourth switch means and a second capacitor and connected between said third and fourth power supply lines, said third and fourth switch means means being on-off controlled complementarily to each other.

3. A semiconductor device claimed in claim 1 wherein said first and second switch means are maintained in an open condition in a standby condition of the semiconductor device, and in a closed condition in an operating condition of the semiconductor device.

4. A semiconductor device comprising:

a circuit composed of MOS transistors having a threshold voltage set to a low value, a source electrode of said MOS transistors being a power supply line which is made alternatively equal to a substrate bias potential of said MOS transistors in an operating condition of the semiconductor device or to a potential higher than said substrate bias potential in an absolute potential in a standby condition of the semiconductor device;

a first power supply line of a high potential;

a second power supply line of a low potential; and a fourth power supply line which is alternatively set to a potential equal to that of said second power supply line by some degree;

wherein said circuit is a memory cell circuit which includes:

a first inverter having a first resistor and a first nMOS transistor connected in series, a second inverter having a second resistor and a second nMOS transistor connected in series, said first inverter and said second inverter being connected in such a back-to-back manner that an output of each inverter is connected to an input of the other inverter, a third nMOS transistor connected between a first bit and the input of said first inverter and having a gate connected to a word line, a fourth nMOS transistor connected between a second bit and the input of said second inverter and having a gate connected to said word line;

a substrate bias terminal of each of said first to fourth nMOS transistors being connected to said second power supply line, a source of each of said first and second nMOS transistors being connected to said fourth power supply line;

the semiconductor device further comprising a control circuit including:

said first power supply line supplied with a high potential, said second power supply line supplied with a low potential, a third power supply line connected through a first potential difference generating circuit to said first power supply line so that a potential lower than said high potential by a potential difference created by said first potential difference generating circuit is supplied to said third power supply line, said fourth power supply line connected through a second potential difference generating circuit to said second power supply line so that a potential higher than said low potential by a potential difference created by said second potential difference generating circuit is supplied to said fourth power supply line, a first switch means connected between said first and third power supply lines for short-circuiting between said first and third power supply lines when said first switch means is closed, a second switch means connected between said second and fourth power supply lines for short-circuiting between said second and fourth power supply lines when said second switch means is closed, and a control line connected to a control input of said first and second switch means to simultaneously on-off control said first and second switch means.

5. A semiconductor device claimed in claim 4 wherein said control circuit further includes a first series circuit composed of a third switch means and a first capacitor and connected between said third and fourth power supply lines, and a second series circuit composed of a fourth switch means and a second capacitor and connected between said third and fourth power supply lines, said third and fourth switch means means being on-off controlled complementarily to each other.

6. A semiconductor device claimed in claim 4 wherein said first and second switch means are maintained in an open condition in a standby condition of the semiconductor device, and in a closed condition in an operating condition of the semiconductor device.

7. A control circuit for a semiconductor device, including a first power supply line supplied with a high potential, a second power supply line supplied with a low potential, a third power supply line connected through a first potential difference generating circuit to said first power supply line so that a potential lower than said high potential by a potential difference created by said first potential difference generating circuit is supplied to said third power supply line, a fourth power supply line connected through a second potential difference generating circuit to said second power supply line so that a potential higher than said low potential by a potential difference created by said second potential difference generating circuit is supplied to said fourth power supply line, a first switch means connected between said first and third power supply lines for short-circuiting between said first and third power supply lines when said first switch means is closed, a second switch means connected between said second and fourth power supply lines for short-circuiting between said second and fourth power supply lines when said second switch means is closed, and a control line connected to a control input of said first and second switch means means to simultaneously on-off control said first and second switch means means.

8. A control circuit claimed in claim 7 further including a first series circuit composed of a third switch means and a first capacitor and connected between said third and fourth power supply lines, and a second series circuit composed of a fourth switch means and a second capacitor and connected between said third and fourth power supply lines, said third and fourth switch means means being on-off controlled complementarily to each other.

9. A control circuit claimed in claim 7 wherein said first and second switch means are maintained in an open condition in a standby condition of the semiconductor device, and in a closed condition in an operating condition of the semiconductor device.

* * * * *